United States Patent [19]

Hiserote

[11] Patent Number: 5,392,227
[45] Date of Patent: Feb. 21, 1995

[54] SYSTEM AND METHOD FOR GENERATING ELECTRONIC CIRCUIT SIMULATION MODELS HAVING IMPROVED ACCURACY

[75] Inventor: Jay A. Hiserote, Beaverton, Oreg.

[73] Assignee: Logic Modeling Corporation, Beaverton, Oreg.

[21] Appl. No.: 920,118

[22] Filed: Jul. 24, 1992

[51] Int. Cl.$^6$ ............................................. G06F 15/18
[52] U.S. Cl. .................................. 364/578; 364/488; 364/489; 364/490
[58] Field of Search ................................ 364/488–491, 364/578; 395/919, 920

[56] References Cited

U.S. PATENT DOCUMENTS

| | | | |
|---|---|---|---|
| 4,342,093 | 7/1982 | Miyoshi | 364/578 |
| 5,036,473 | 7/1991 | Butts et al. | 364/489 |
| 5,062,067 | 10/1991 | Schaefer et al. | 364/578 |
| 5,067,091 | 11/1991 | Nakazawa | 364/490 |
| 5,068,812 | 11/1991 | Schaefer et al. | 364/578 |

OTHER PUBLICATIONS van der Hoeven et al. "A Model for the High-Level Description and Simulation of VLSI Networks," *IEEE Micro*, Aug. 1990, pp. 41–48.

Lee et al., "Two New Techniques for Compiled Multi-Delay Simulation," 1992, IEEE, pp. 175–179.

Maurer et al., "Compiled Unit–Delay Simulation for Cyclic Circuits," 1992, IEEE, pp. 184–188.

"SSIM: A Software Levelized Compiled–Code Simulator," L, Wang, N. Hoover, E. Porter, and J. Zasio, Proceedings of the 24th ACM/IEEE Design Automation Conference, 1987, paper 2.1, pp. 2–8.

"Techniques for Unit–Delay Compiled Simulation," P. Maurer and Z. Wang, Proceedings of the 27th ACM-/IEEE Design Automation Conference, 1990, paper 27.1, pp. 480–484.

"LECSIM: A Levelized Event Driven Compiled Logic Simulator," Z. Wang and P. Maurer, Proceedings of the 27th ACM/IEEE Design Automation Conference, 1990, paper 27.3, pp. 491–496.

"Hierarchical Topological Sorting of Apparent Loops via Partitioning," John F. Beetem, IEEE Transactions on Computer–Aided Design of Integrated Circuits and Systems, vol. 2, No. 5, May 11, 1992, pp. 607–619, New York, N.Y.

"Scheduling Blocks of Hierarchical Compiled Simulation of Combinational Circuits," Peter M. Maurer, IEEE Transactions on Computer–Aided Design of Integrated Circuits and Systems, vol. 10, No. 2, Feb. 10, 1991, pp. 184–192, New York, N.Y.

*Primary Examiner*—Kevin J. Teska
*Assistant Examiner*—Leigh Marie Garbowski
*Attorney, Agent, or Firm*—Stoel Rives Boley Jones & Grey

[57] ABSTRACT

A system and method accurately translate a structural data file (30) that describes a complex logic circuit into a simulation model file (40) executable by a simulator (42). A net-list (34) is traversed, and the resulting model description is compiled into structural partitions including a WHEN-CONDITION partition (WC) that identify boundaries between synchronous and asynchronous subcircuits. The simulation model is also divided into execution time levels by a partitioned levelization method. Asynchronous feedback loops, which ordinarily lead to levelization failures, are correctly modeled by inserting time delay "levelers" (254, 262) into the feedback loop model. The resulting simulation model includes re-evaluation and evaluation stability checking steps (152, 230, 232, 276) that provide correct functional and timing evaluation of the simulation model.

9 Claims, 12 Drawing Sheets

SYSTEM AND METHOD FOR GENERATING ELECTRONIC CIRCUIT SIMULATION MODELS HAVING IMPROVED ACCURACY

TECHNICAL FIELD

This invention relates to electronic design automation and, more particularly, to a method for automatically developing from logic circuit design data an accurate simulation model of a logic circuit.

BACKGROUND OF THE INVENTION

There are known methods for proving the design worthiness of an electronic circuit prior to committing extensive resources to making it in production quantities. Traditional methods include making a number of prototypes of the circuit and subjecting them to laboratory testing. This method is time consuming and expensive, and often requires the use of not readily available, state-of-the-art electronic components. When circuit faults are found, corrections to the prototypes take time and are prone to error. The fast-moving pace of the electronics marketplace demands a more rapid way of developing products using such circuits.

Electronic circuit designers have long appreciated the value of using computers to simulate circuit designs. Simulation promises a faster and less expensive circuit design process alternative because design faults can be found and eliminated before an actual circuit is produced. In practice, simulation often eliminates the circuit prototyping step and is virtually essential to integrated circuit development.

However, simulation has not always been successful for proving the design worthiness of boardlevel circuits and complex integrated circuits. Such designs are characterized by a mix of synchronous and asynchronous logic functions and typically include multiple complex circuits, some of which are still in development during simulation. The simulation of such designs requires extensive computer time, and the accuracy of the simulation results is often questionable. The expense of computer time and the engineering time required to program the simulation, together with the risk of questionable results, has led many circuit designers to simply "give up" on simulation as a practical alternative to prototyping.

The above realization has created a market for faster and more easily usable simulators that are capable of accurately simulating highly complex logic circuits. Representative simulators include Verilog-XL ™ available from Cadence Design Systems, San Jose, Calif.; QuickSim ™ and QuickSim II ™ available from Mentor Graphics Corporation, Wilsonville, Oreg.; and ViewSim ™ available from Viewlogic Systems, Inc., Marlboro, Mass.

FIG. 1 shows the relationship between a typical prior art circuit development process 10 and the accuracy or specificity of the circuit design corresponding to each step of the process.

At the highest, least accurate level, the circuit is described only in terms of a design specification or architectural description 12 of a product in which the circuit will be used.

A behavior level 14 description is more design specific and describes the circuit in functional block diagram terms such as, for example, counters, processors, or registers.

A register transfer logic level 16 describes the circuit design by the interconnection of functional blocks in terms such as processor instructions, counter values, bus bit-widths, and Boolean logic expressions.

A gate level 18 describes each functional block as detailed interconnections of logic function symbols.

A switch level 20 describes the logic symbols of the gate level in terms of transistor level circuit designs.

A layout level 22 describes the topological or physical positioning and electrical interconnections of the above-described circuit design elements. If the circuit design is implemented on an etched circuit board, the layout level is the lowest required design level.

If the circuit design is implemented on an integrated circuit, the layout level is further sub-divided into a silicon design level 24 comprising multiple mask layers delineating the fabrication steps of the integrated circuit.

Design accuracy generally increases toward the lower levels of the circuit development process. However, for a given design, simulation at lower levels requires additional computer time to analyze the added complexity inherent at lower levels. There is, therefore, a tradeoff between design accuracy and simulation performance.

Because typical circuit designs include a mix of sub-circuits, some well understood and others untested, a technique known as "mixed-mode" simulation has evolved. Mixed-mode simulation typically employs behavior level models of well-understood subcircuits, such as purchased components, and gate level models of untested sub-circuits as a trade-off between design accuracy and simulation performance.

Behavior level 14 simulation models of commercially available logic components are typically manually programmed by the designers of the larger circuit being simulated. Manual programming is a time-consuming, error prone task.

Recently, behavioral level 14 models of commercially available logic components have become available. For example, the Logic Automation Description Language ("LADL"), available from Logic Modeling Corporation, the assignee of the present application, provides a library of accurate simulation models for a wide variety of commercially available components. Circuit designers using LADL models are relieved from manually programming conventional logic components to concentrate on developing their proprietary circuit design and associated simulation model programs. The resulting simulation requires reduced model programming time and produces reasonably accurate results.

Market acceptance of commercially available simulation models has created a demand for simulation models of more complex components such as peripheral controllers, microprocessors, and memories. Moreover, circuit designers demand gate level 18 models in addition to behavior level 14 models to support the accuracy required by complex circuit simulations. Indeed, some simulators will not operate in mixed-mode. Developing accurate gate level 18 simulation models of complex components requires automated model development tools.

FIG. 2 shows an exemplary prior art automated simulation model generation process. A circuit design is stored in a structural data file 30 such as the standard Electronic Design Interchange Format ("EDIF"). Structural data file 30 typically includes data not required for a simulation model, so structural data file 30 is translated by a data translator 32 into a net-list 34 readable by a simulation model compiler 36. Simulation model compiler 36 performs various steps on net-list 34 including structural partitioning and assignment of execution time levels, referred to as "levelization." When model compiler 36 is finished, an output translator 38 translates the compiled model into a model file 40 compatible with the requirements of a particular simulator 42.

Development of such simulation automation tools is a major focus of development efforts in the electronic design automation field. For instance, Wang, Hoover, Porter, et al, in "SSIM: A Software Levelized Compiled-Code Simulator", *Proceedings of the 24th ACM/IEEE Design Automation Conference*, 1987, describe levelization and simulation techniques that increase the performance of simulating synchronous logic circuits. They also state that circuits having feedback loops cannot be levelized.

Maurer and Wang in "Techniques for Unit-Delay Compiled Simulation", *Proceedings of the 27th ACM/IEEE Design Automation Conference*, 1990, describe performance and accuracy improvements in simulating logic circuit time delays. Again, the results do not apply to asynchronous logic circuits.

Wang and Maurer in "LECSIM: A Levelized Event Driven Compiled Logic Simulator" *Proceedings of the 27th ACM/IEEE Design Automation Conference*, 1990, describe techniques for levelizing circuit models containing feedback loops. However, functional evaluation problems associated with feedback loops are not addressed.

The above-described work has been successful whenever the modeled circuit is entirely synchronous. However, net-lists for highly complex circuits, such as integrated circuits, when translated into simulation models by conventional techniques, exhibit timing and functional evaluation errors. Such errors are not surprising because integrated circuits often have system bus control and distributed clocking subcircuits that exhibit asynchronous behavior. Technology trends suggest that integrated circuits are becoming more like "systems on chips" that actually require the extensive use of asynchronous, "self-timed" subcircuits.

U.S. Pat. No. 4,342,093 of Miyoshi for METHOD OF DIGITAL LOGIC SIMULATION describes an alternative automated simulation model generating approach. A simulation system substitutes the functionality of an actual component into the simulation model of a larger circuit whenever the simulator requires a functional evaluation of the component. This technique works well where software models of complex integrated circuits are unavailable. However, the hardware needed to support such simulation modeling is expensive and is useless if the component being modeled is unavailable or is still under development and not functioning properly.

What is needed, therefore, is a system and an automated method for generating an accurate simulation model of a complex synchronous/asynchronous logic circuit from a structural data description of the circuit.

SUMMARY OF THE INVENTION

An object of this invention is, therefore, to provide a system and method for translating gate level design data into behavioral level simulation models that are accurate and have high simulation performance.

Another object of this invention is to provide accurate simulation models for complex integrated circuits prior to the availability of the circuits.

A further object of this invention is to eliminate modeling problems associated with complex logic circuits exhibiting mixed synchronous and asynchronous functional behavior.

Still another object of this invention is to generate simulation models that are executable by a variety of commercially available logic simulators.

This invention provides a system and method for accurately translating gate level net-lists describing a complex logic circuit into a simulation model expressed in a transportable language such as "C." Functional evaluation of the simulation model is improved by moving the source of model development data to the gate level. Translation of the net-list entails tracing the net-list and dividing it into structural partitions. These partitions include a WHEN-CONDITION partition that is useful for identifying boundaries between synchronous and asynchronous sub-circuits. The net-list is also analyzed and compiled into execution time levels by a process that is based on the structural partitioning. Asynchronous feedback loops that ordinarily lead to levelization failures are correctly modeled by the insertion of time delay-like elements, referred to as "levelers" in the feedback loops.

The resulting simulation model includes re-evaluation and evaluation stability checking steps that provide correct functional evaluation of asynchronous feedback loops.

Additional objects and advantages of this invention will be apparent from the following detailed description of a preferred embodiment thereof which proceeds with reference to the accompanying drawings.

DETAILED DESCRIPTION OF PREFERRED EMBODIMENT

Simulating a logic circuit and its related timing entails programming a simulation model for the logic circuit. In practice, a simulator is triggered by a logic state change (hereafter referred to as a "change") to invoke the simulation model of the circuit. Such a technique is called "event-driven simulation" and is wellknown to those skilled in the art. A change causes the modeled circuit function to be evaluated by the simulator. Following evaluation, the appropriate circuit timing is selected from a delay table for the circuit. The model code then returns a post-evaluation set of logic states and related delay time values to the simulator.

Simulation of a logic circuit can be no more accurate than the accuracy of the simulation model of the circuit. Time delay modeling is a particularly error prone operation that occurs during steps of an automated model development processes. The steps include tracing a net-list describing the circuit to sort the various circuit elements into functional partitions and execution time levels. This invention includes methods for eliminating time delay-induced modeling errors related to partitioning and levelization.

The subtle difficulty of correctly modeling time delays is best emphasized by way of a number of examples. Each example describes a different type of timing problem, a prior art solution to that type of problem, and the drawbacks of that solution. Each example progressively adds complexity to the time delay modeling problem addressed by previous examples such that the examples collectively describe an evolution in the development of prior art models that lead to the model development method of this invention. The examples are described with reference to the following figure groupings.

FIGS. 3A, 3B, 3C, and 4 support the description of an asynchronous prior art ROM array gate-level representation example and its related timing problem.

FIGS. 5A, 5B, 6A, 6B, and 7 support the description of a synchronous prior art ROM array gate-level representation example and its related timing problem.

Figure 8:
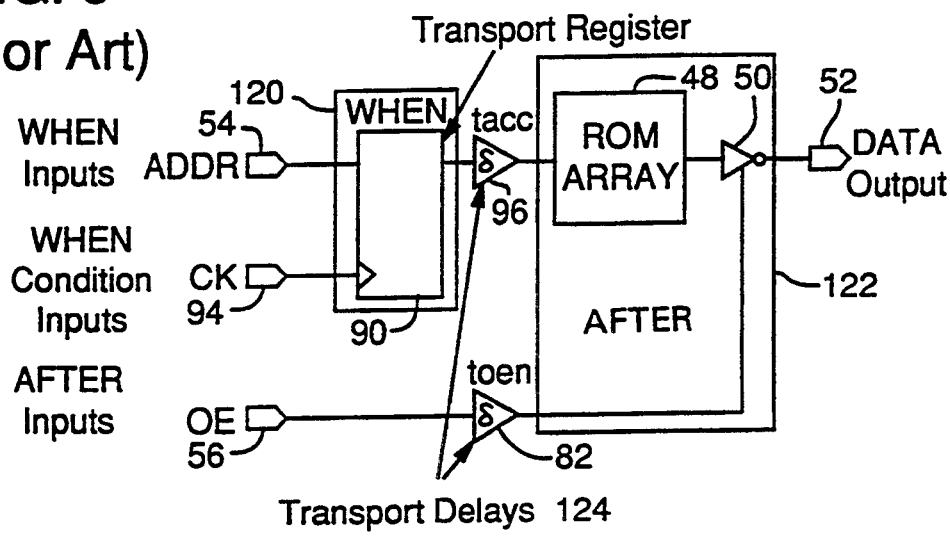
FIG. 8 is a block diagram showing the circuit representation of FIG. 7 with corresponding prior art circuit modeling elements overlaid thereon.
Figure 9:
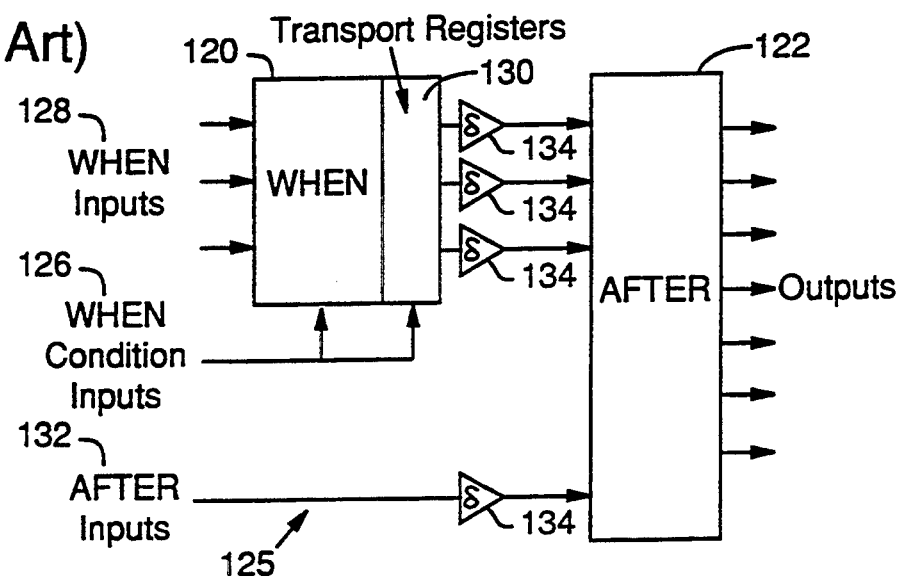
FIG. 9 is a generalized block diagram of a prior art simulation model.
Figure 10:
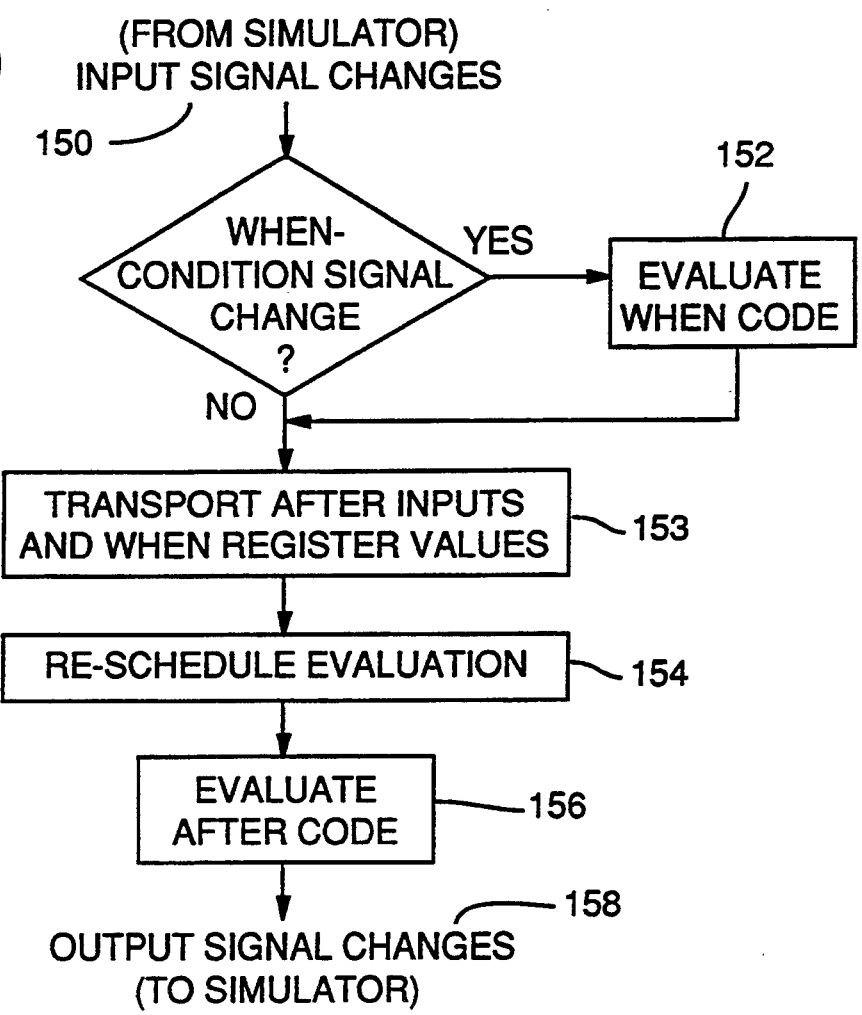
FIG. 10 is a flow diagram of the execution by a simulator of the prior art simulation model of FIG. 9.

FIGS. 8, 9, and 10 support the description of a partitioned prior art gate-level model and its execution in a simulator.

FIGS. 11A, 11B, 11C, and 11D support the description of an improved model partitioning process according to this invention as applied to an example circuit having mixed synchronous and asynchronous subcircuits.

FIGS. 12A, 12B, 12C, and 12D support the description of a prior art levelization method applied to an example synchronous XOR circuit.

FIGS. 13, 14, 15, 16, and 17 support the description of a partitioned levelization method according to this invention as applied to the mixed synchronous and asynchronous circuit example.

Figure 18:
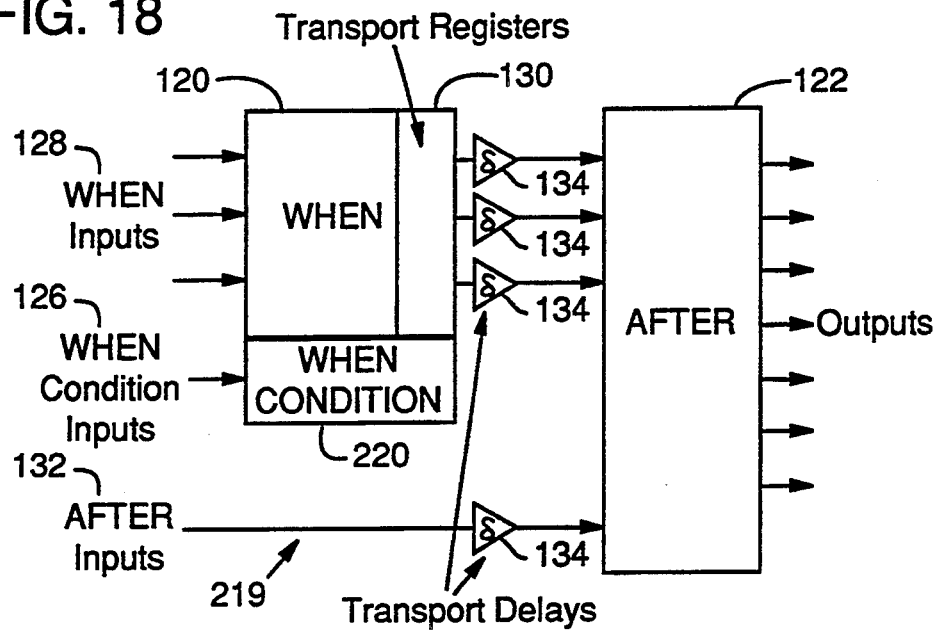
FIG. 18 is a generalized block diagram of an improved simulation model according to this invention.
Figure 19:
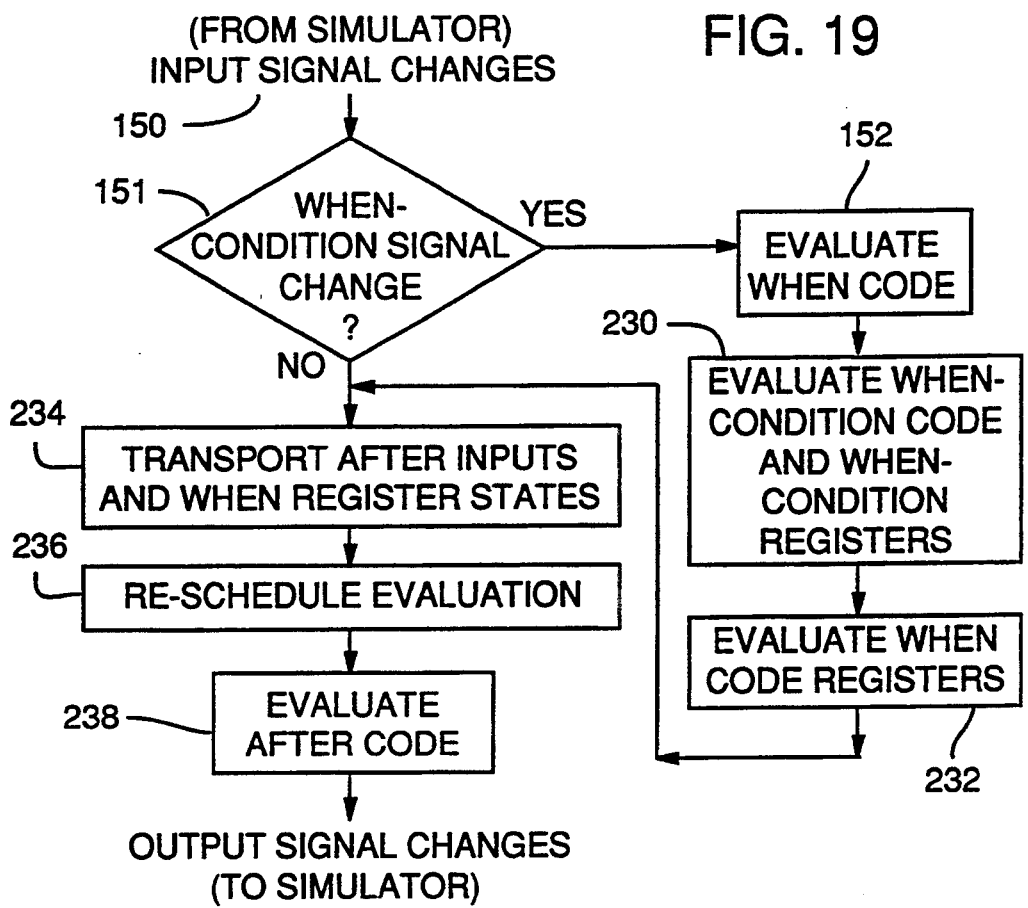
FIG. 19 is a flow diagram of the execution by a simulator of the simulation model of FIG. 18.

FIGS. 18 and 19 support the description of an improved partitioned circuit model and its execution in a simulator according to this invention.

FIGS. 20A, 20B, 21A, 21D, and 22 support the description of example circuits having asynchronous feedback loops and a solution according to this invention for time delay modeling problems presented by such circuits.

Figure 1:
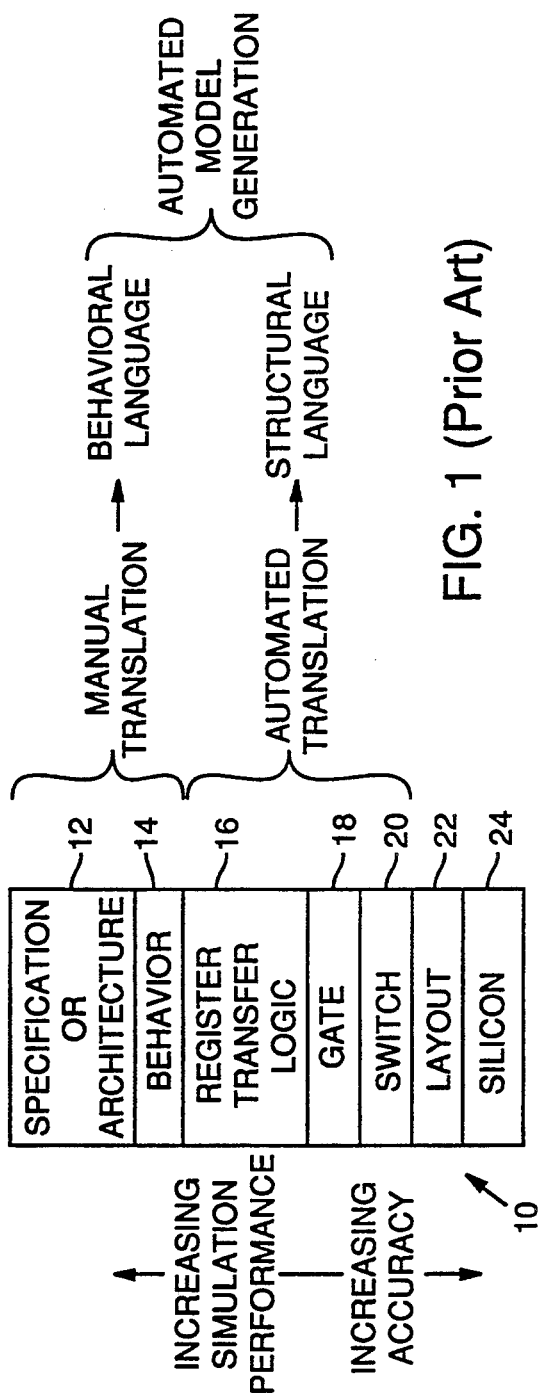
FIG. 1 is a graphic representation of the tradeoff existing between design specificity and model accuracy at various steps in a prior art circuit development process.
Figure 2:
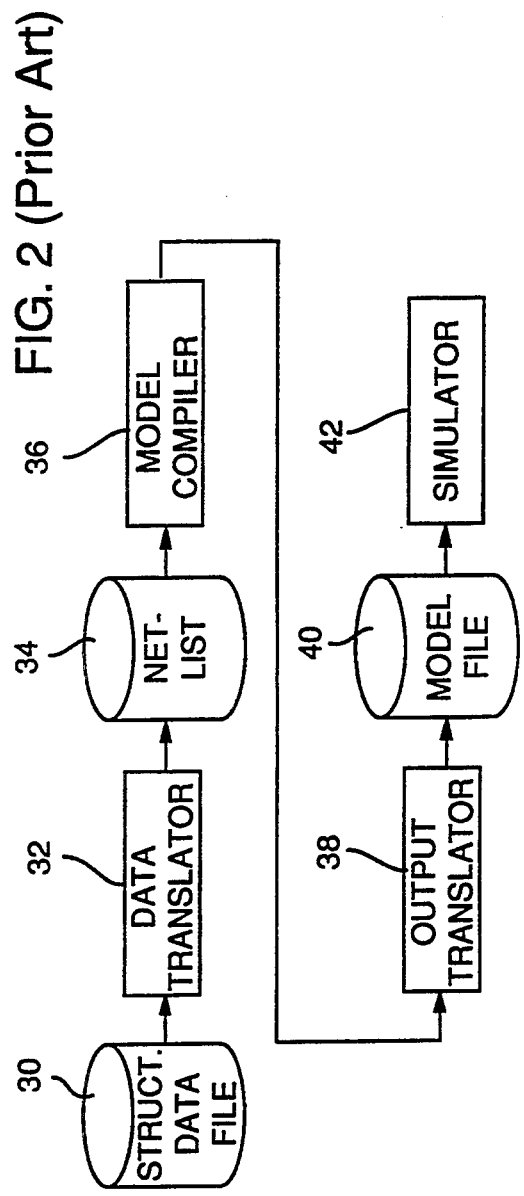
FIG. 2 is a simplified symbolic block diagram showing a prior art automated simulation model development process.
Figure 3A:
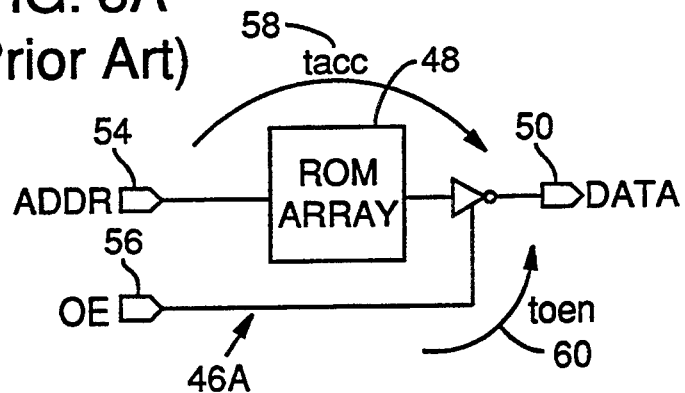
FIG. 3A shows a gate-level representation of memory access and output enable propagation time paths associated with a prior art ROM array and tri-state output stage.

The first example, which is diagrammed in FIG. 3A, is a gate-level representation of a circuit 46A that includes a read-only-memory ("ROM") 48 connected to a tri-state driver 50. A tri-state output signal appears at a DATA output 52 in response to an address signal applied to ADDR lines 54. The three states generated by tri-state devices, such as tri-state driver 50, are a logic 1 state ("high"), a logic 0 state ("low"), or a high-impedance state ("disabled"). The high and low states are generated only when the device is enabled. DATA output 52 of tri-state driver 50 is enabled and disabled in response to an output enable signal OE 56. Circuit 46A has two asynchronous propagation delay paths, a memory access time ("tacc") 58 representing the time from a change on ADDR lines 54 to a change on DATA output 52 and an output enable time ("toen") 60 representing the time from a change of OE 56 to its effect on DATA output 52.

Figure 3B:
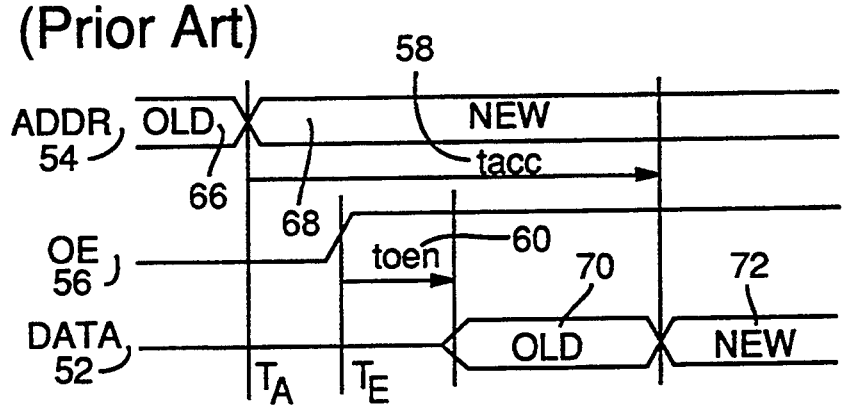
FIG. 3B is a waveform diagram showing a set of correct timing relationships among signals of the prior art circuit representation of FIG. 3A.

FIG. 3B presents a set of typical timing relationships among ADDR lines 54, DATA output 52, OE 56, tacc 58, and toen 60 and shows the complex timing behavior that results when nearly simultaneous signal changes occur. FIG. 3B shows ADDR lines 54 changing from an OLD address 66 to a NEW address 68 at a time $T_A$ and OE 56 changing to enable tri-state driver 50 prior to the end of tacc 58. An OLD value 70 from ROM 48 appears first on DATA output 52, followed by a NEW value 72 at the end of tacc 58. A correctly implemented simulation model for circuit 46A should generate both OLD value 70 and NEW value 72.

Figure 3C:
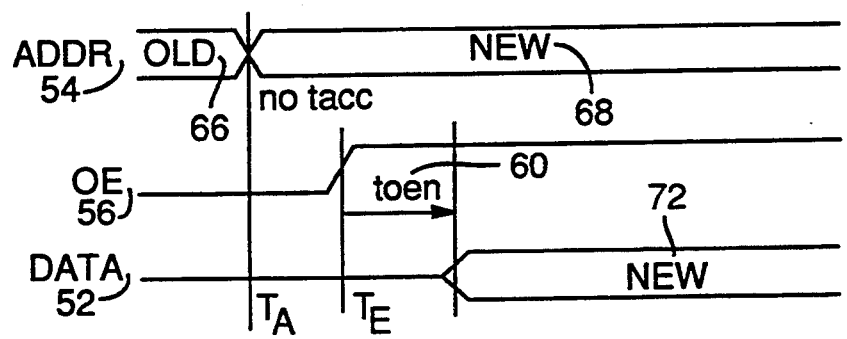
FIG. 3C is a waveform diagram showing a set of incorrect timing relationships that result when the circuit representation of FIG. 3A is simulated using a prior art modeling method.

Referring to FIG. 3C, the conventional modeling of circuit 46A results in the following erroneous sequence of simulated events. The change on ADDR lines 54 to NEW address 68 at time $T_A$ invokes evaluation of the model causing a newly addressed data value in ROM 48 to appear at the input of tri-state driver 50. Because OE 56 is low, tri-state driver 50 is disabled preventing a change at DATA output 52. When OE 56 goes high at an enable time $T_E$, tri-state driver 50 is enabled and DATA output 52 prematurely returns to the simulator the current NEW value 72 of ROM 50 as addressed by the current NEW address 68.

The delay time between toen 60 and tacc 58 is inadvertently ignored, thereby preventing OLD value 70 data from appearing at DATA output 52. The conventional simulation model gives the false impression NEW value 72 is available before the circuit 46A would actually allow it, resulting in a simulation failure.

Figure 4:
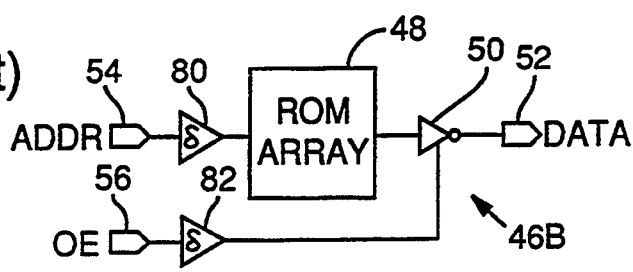
FIG. 4 is a gate-level representation of the circuit representation of FIG. 3A further including prior art propagation time delay modeling elements in each input signal line.

This problem can be eliminated by applying the timing differently to the simulation model. FIG. 4 shows a gate-level representation of a circuit 46B having a tacc delay 80 added to ADDR lines 54 and a toen delay 82 added to OE 56. Address lines 54 change at time $T_A$, and ROM 48 receives NEW address 68 after tacc delay 80 at which time the simulator evaluates circuit 46B. Likewise, when OE 56 goes high at time $T_E$, the change is delayed at tri-state driver 50 by toen delay 82, following which the simulator once again evaluates circuit 46B. Toen delay 82 is shorter than tacc delay 80, thereby enabling tri-state driver 50 before OLD address 66 is applied to ROM 48 resulting in OLD value 70 DATA correctly appearing at output 52. After tacc delay 80, circuit 46B is reevaluated, and DATA output 52 properly changes from OLD value 70 to NEW value 72.

Figure 5A:
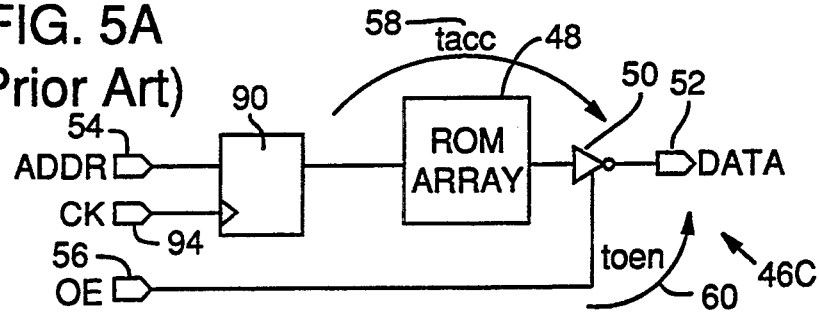
FIG. 5A shows memory access and output enable propagation time paths associated with a prior art ROM array circuit representation having a clock controlled register, and a tri-state output stage.
Figure 5B:
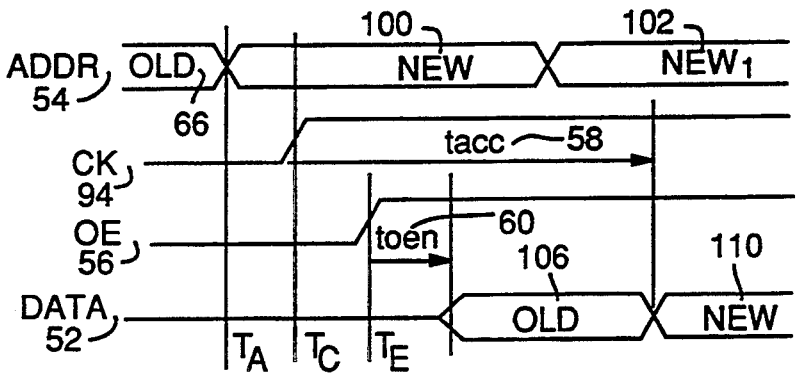
FIG. 5B is a waveform diagram showing a set of correct timing relationships among signals of the prior art circuit representation of FIG. 5A.

In the previous example, moving the propagation delays to the inputs of a simulation model results in a more accurate simulation model evaluation. However, FIG. 5A shows a gate-level representation of a circuit 46C having a clocked address register 90 that presents yet another timing problem. FIG. 5B presents the correct timing relationships for circuit 46C. Unlike the timing of circuit 46B, tacc 58 starts at a time $T_C$ when a clock signal CK 94 changes logic states rather than at time $T_A$ when ADDR input 54 changes.

Figure 6A:
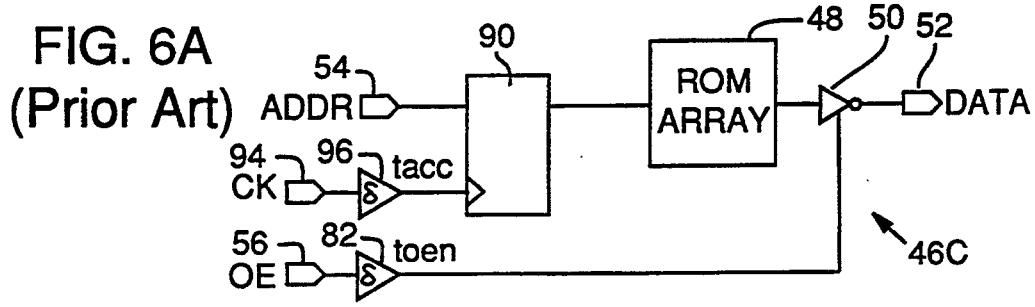
FIG. 6A is a gate-level representation of the circuit representation of FIG. 5A further including prior art propagation time delay modeling elements in each input signal line.
Figure 6B:
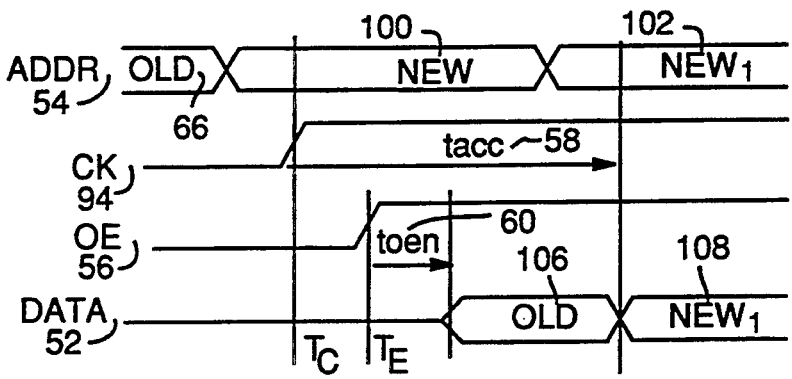
FIG. 6B is a waveform diagram showing a set of incorrect timing relationships that result when the circuit representation of FIG. 5A is simulated using the prior art time delay modeling elements located as shown in FIG. 6A.

Following the previous example, FIG. 6A shows tacc delay 96 and toen delay 82 applied to the inputs of circuit 46C. However, FIG. 6B presents the incorrect timing relationships that result from evaluating circuit 46C. The timing evaluation problem occurs when ADDR input 54 changes from a NEW address 100 to a NEW1 address 102 after time $T_C$ but before completion of tacc 58. Evaluation of ROM 48 does not occur when CK 94 changes at time $T_C$, but waits until CK 94 is delayed by tacc 58. Prior to that evaluation, OE 56 changes at time $T_E$ and is delayed by toen 60 causing an evaluation of circuit 46C. Because toen 60 is shorter than tacc 58, OLD address 66 is still applied to ROM 48 and an OLD data 106 value is correctly presented on DATA output 52. At the end of tacc 58, circuit 46C is reevaluated and a NEW1 address 102 is stored in clocked address register 90 and applied to ROM 48 resulting in a NEW1 data 108 value erroneously appearing at DATA output 52.

The application of propagation delays to inputs was shown to work for modeling asynchronous delays as presented in circuit 46B but is clearly inadequate for modeling synchronous (clocked) delays as presented in circuit 46C.

Figure 7:
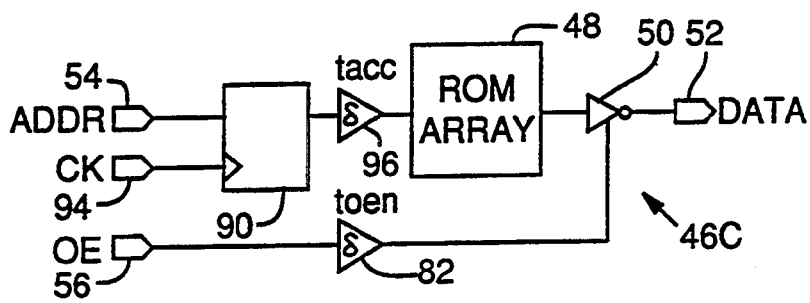
FIG. 7 is a gate-level representation of the circuit of FIG. 5A further including correctly located prior art propagation time delay modeling elements.

FIG. 7 shows circuit 46C with a possible solution for the above-described synchronous delay modeling problems by inserting tacc delay 96 after clocked address register 90. Referring again to FIG. 5B, when CK 94 changes, clocked address register 90 stores NEW address 100 and applies it to ROM 48 after tacc 58. The signal OE changes at time $T_E$ and enables tri-state driver 50 following toen 60, thereby presenting OLD data 106 to DATA output 52 at the correct time. Following tacc 58, NEW address 100 is presented to ROM 48 and a NEW data 110 value is correctly presented at DATA output 52.

As described earlier, translating a logic circuit such as circuit 46C into a simulation model requires partitioning the various circuit elements and sorting them into execution time levels. A prior art partitioning scheme illustrated in FIG. 8 shows clocked address register 90 of circuit 46C within a WHEN block 120 and ROM 48 and tri-state driver 50 within an AFTER block 122 separated by a tacc 96 and toen 82. ADDR lines 54, CK 94, and OE 56 inputs are referred to respectively as "When," "When-Condition," and "After" inputs. Clocked address register 90 is referred to as a "Transport Register." WHEN block 120 includes all circuit elements that are driven "when" an input signal changes, and AFTER block 122 includes all circuit elements that drive outputs of the logic circuit "after" the signal changes propagate through the logic circuit. A set of transport delays 124 representing propagation delay times through the circuit elements is interposed between WHEN block 120 and AFTER block 122.

It is only a small transition from FIG. 8 to FIG. 9, which shows a block diagram of a prior art simulation model 125, such as a LADL model, used for evaluating synchronous logic circuits such as circuit 46C. In simulation model 125, WHEN block 120 includes executable code that represents a corresponding circuit function that occurs when synchronous inputs change. The synchronous inputs are referred to as When-Condition 126 control inputs and When 128 data inputs. Transport registers 130 drive outputs directly or indirectly, e.g., via a ROM array. Inputs that drive outputs directly or indirectly are referred to as After inputs 132. Delay elements applied to either Transport Registers 130 or After inputs 132 are referred to as Transport Delays 134. AFTER block 122 contains executable code that represents a circuit function that occurs in response to the above described signals.

FIG. 10 is a flow diagram of the execution steps of prior art simulation model 125 and its interaction with a typical logic simulator. For now, the process of FIG. 10 is shown for reference only. An understanding of the need for improvements to the process and how those improvements are made will evolve as additional examples are described.

Applying prior art simulation model 125 to a logic circuit having a mix of synchronous and asynchronous subcircuit elements creates additional timing evaluation problems and requires a process for classifying the circuit elements as members of various partitions, including a partition for asynchronous subcircuit elements.

Figure 11A:
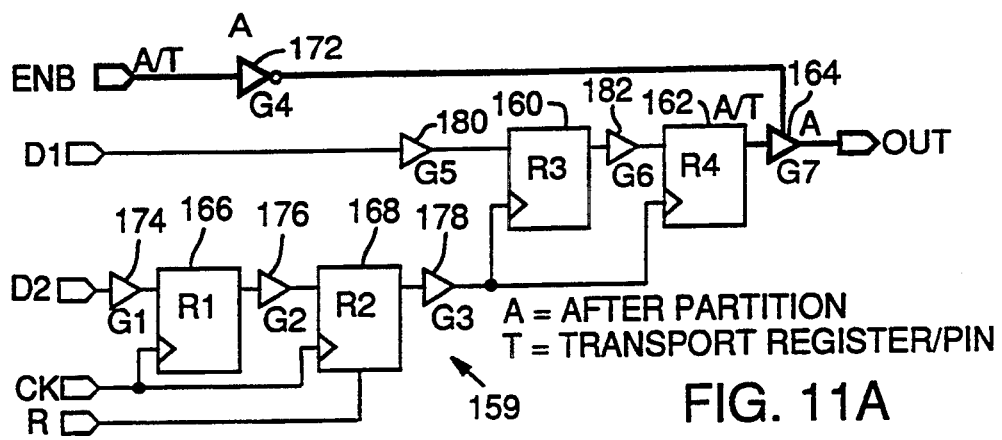
FIGS. 11A, 11B, and 11C show a simplified schematic circuit diagram of a two-stage shift register driving a second two-stage shift register having a tri-state controlled output, and highlighting respective AFTER, WHEN, and WHEN-CONDITION code partitions.

FIG. 11A shows a mixed synchronous and asynchronous logic circuit 159 that has a two-stage synchronous shift-register formed by flip-flops 160 and 162, a tri-state output driver 164, and a second synchronous shift register formed by flip-flops 166 and 168 for generating an asynchronously delayed clock signal 170. Buffers 172, 174, 176, 178, 180, and 182 have been added to the circuit to act as "place holders" for the partition classification process.

A net-list for circuit 159 is shown below:

G1: $buf (D2, G1Out);
G2: $buf (R1Out, G2Out);
G3: $buf (R2Out, G3Out);
G4: $inv (ENB, G4Out);
G5: $buf (D1, G5Out );
G6: $buf(R3Out, G6Out);
G7: $tsbuf(R4Out, G4Out, OUT);
R1: $dff(CK, G1Out, $0, $0, R1Out);
R2: $dff(CK, G2Out, $0, R, R2Out);
R3: $dff (G3Out, G6Out, $0, $0, R3Out);
R4: $dff(G3Out, G6Out, $0, $0, R4Out);

Where "$buf" is a buffer, "$tsbuf" is a tri-state buffer, "$dff" is a D-type flip-flip (a register), and "$0" is a constant zero logic state, such as an electrical ground connected to a set or reset input of a D-type flip-flop.

The partitioning process steps include 1) classifying the elements belonging to an AFTER partition A, 2) classifying the elements belonging to a WHEN partition W, and 3) classifying the elements belonging to an asynchronous WHEN-CONDITION partition WC.

FIG. 11A shows circuit 159 with AFTER partition A elements highlighted. Elements in AFTER partition A are identified by tracing along a trace path, the net-list signal paths from output ports back through each driving element and its predecessor elements until either an input port or a register output is reached. Each element contained within the partition is labeled "A". The trace termination points are either inputs to AFTER partition A or Transport Register signals "T." The AFTER partition A trace starts at the "OUT" port and traces back through tri-state driver 164. The trace branches and continues from tri-state driver 164 back through buffer 172 and terminates at the input port "ENB". The other branch continues from tri-state driver 164 terminating at the output of flip-flop 162. The ENB input and output of flip-flop 162 are transport values (AFTER inputs).

Figure 11B:
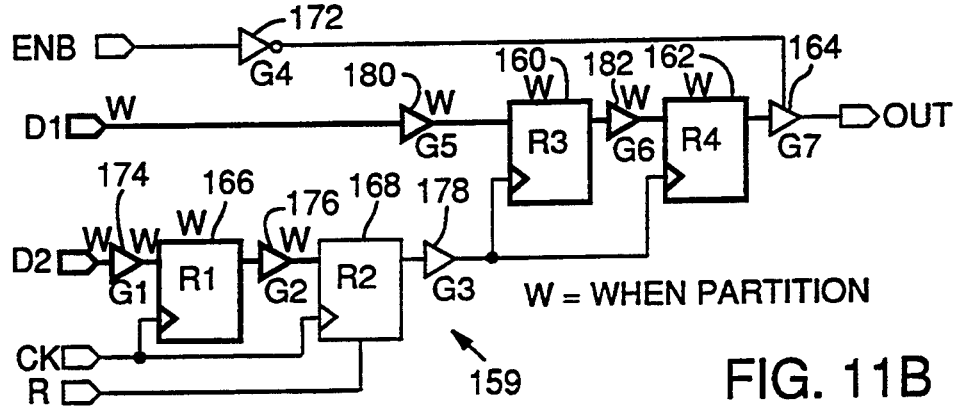

FIG. 11B shows circuit 159 with WHEN partition W elements highlighted. Elements in WHEN partition W are identified by tracing along a trace path, the net-list signal paths from each register synchronous data input back through each associated driving element and its predecessor elements until either an input port or a register output is reached. Each element contained in the partition is labeled "W", and the trace termination points become inputs to WHEN partition W. In addition to the labeled elements, all registers with data inputs and outputs within WHEN partition W are labeled "W" including any register with outputs labeled as transport values. The WHEN partition W trace begins at flip-flops 166, 168, 160, and 162 in turn. Buffers 174, 176, 178, and 182 are labeled as members of WHEN partition W. Input ports D1 and D2 are WHEN inputs, and flip-flops 166, 160, and 162 are WHEN registers. Flip-flop 168 has an input driven from WHEN partition W, but its output is neither part of WHEN partition W nor a "Transport" value.

Figure 11C:
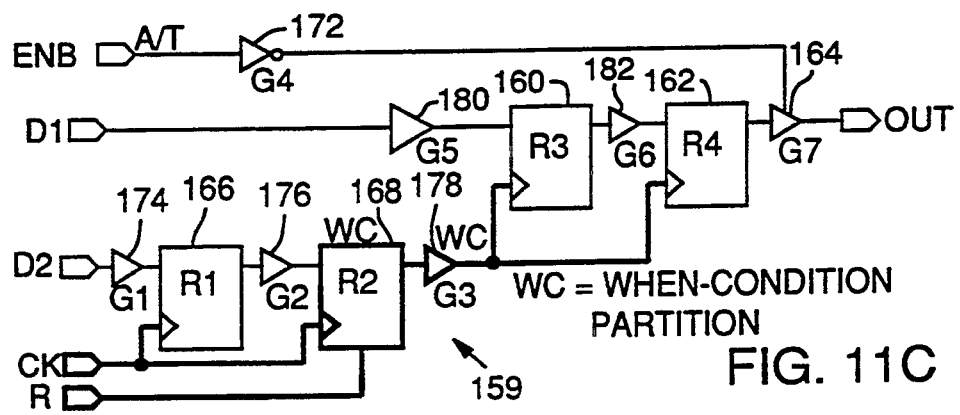

FIG. 11C shows circuit 159 with WHEN-CONDITION partition WC elements highlighted. WHEN-CONDITION partition WC is identified by tracing along a trace path, the net-list signal paths from register asynchronous control inputs (e.g., clock, set, and reset) back through each driving element and its predecessor elements until either an input port or a register output is reached. Each element contained in the WHEN-CONDITION partition is labeled "WC", and the trace termination points are inputs to WHEN-CONDITION partition WC. In addition to the elements labeled, all registers with control inputs and outputs within WHEN-CONDITION partition WC are labeled as WHEN-CONDITION registers. The WHEN-CONDITION partition WC trace begins in turn at flip-flops 166, 168, 160, and 162. Buffer 178 is labeled as a member of WHEN-CONDITION partition WC. Input ports "CK" and "R" are WHEN-CONDITION inputs, and flip-flop 168 is a WHEN-CONDITION register.

Figure 11D:
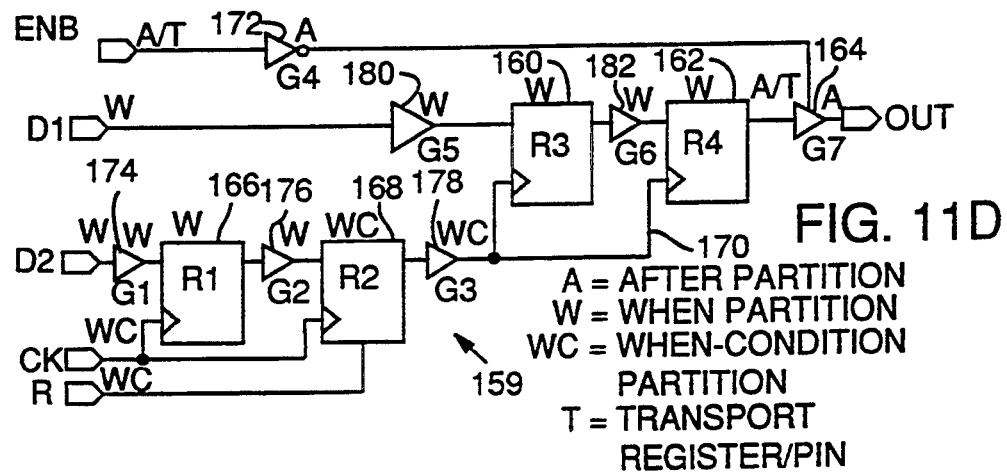
FIG. 11D shows the complete structural partitioning of the circuit of FIG. 11A.

FIG. 11D shows circuit 159 with all the partitions labeled.

After partitioning, the next step in perfecting a simulation model is levelization, a process that places each circuit element into its correct execution time level, thereby causing a correct order of evaluation when the model is executed by a simulator. The conventional technique levelizes synchronous logic circuits and consists of identifying each level by tracing data flow through the net-list for the logic circuit from input ports to output ports and register inputs. The logic elements in each level are evaluation order independent.

FIGS. 12A–12D show an XOR gate circuit 190 and the data flow processing necessary to levelize its structure in accordance with a prior art levelization method. Circuit 190 includes a two-input AND gate 200, an inverter 202, two two-input NAND gates 204 and 206, and a three-input NOR gate 208.

Figure 12A:
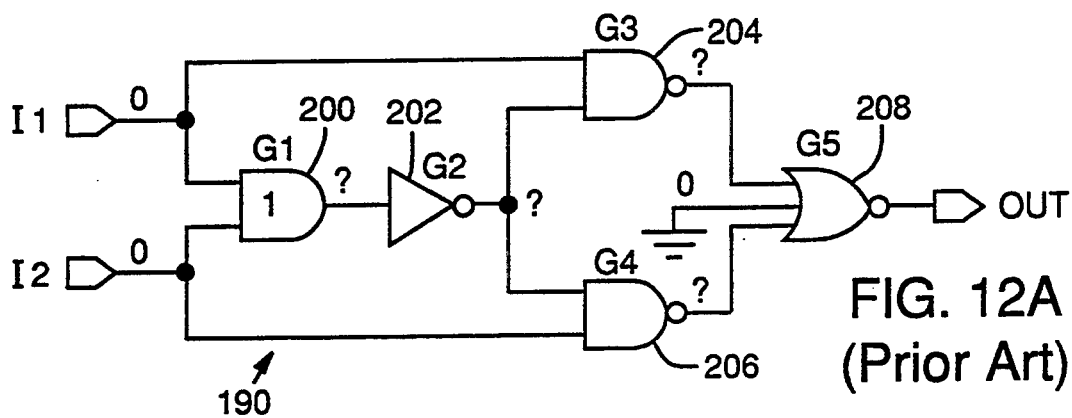
FIG. 12A is a schematic circuit diagram of an exclusive-OR ("XOR") gate circuit labeled with levelization initial conditions according to a prior art levelization method.

FIG. 12A shows a set of initial levelization conditions. Inputs "I1" and "I2" and a ground connected to one input of three-input NOR gate 208 are initialized to level-0. Each element is levelized by determining whether its inputs have defined levels. If all the inputs of element have defined levels, the element is a member of the level being processed and the net-list is marked accordingly.

A first levelization processing pass identifies level-1 elements of circuit 190. Both inputs to AND gate 200 are defined as level-0, so it is marked level-1 in the net-list. The input of inverter 202 is not defined. NAND gates 204 and 206 and NOR gate 208 each have only one input defined. After checking the inputs for each element, the level of those now defined is propagated forward to the next set of inputs thereby setting the levelization conditions for the next processing pass.

Figure 12B:
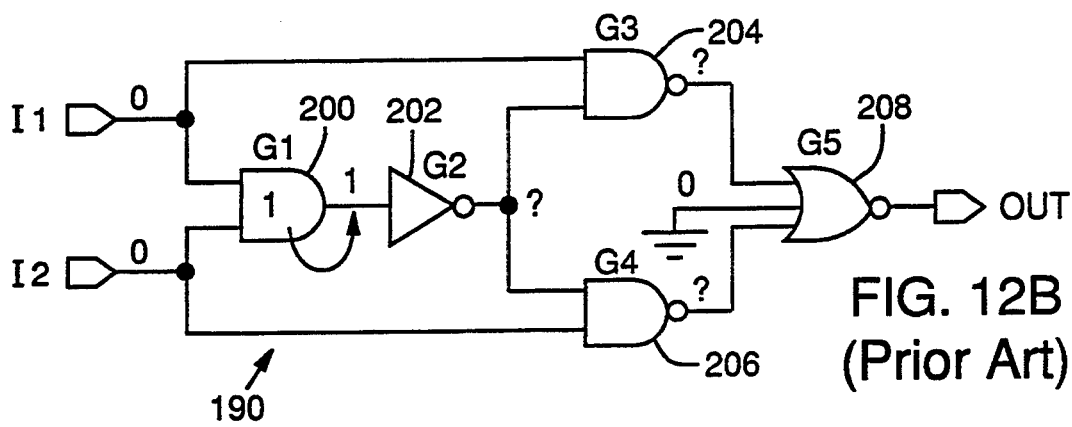
FIGS. 12B, 12C, and 12D show the XOR circuit of FIG. 12A labeled with, respectively, "level-1" "level-2", and completed levelization conditions for the prior art levelization method.

FIG. 12B shows AND gate 200 marked as level-1 and the propagation of level-1 to its output.

Figure 12C:
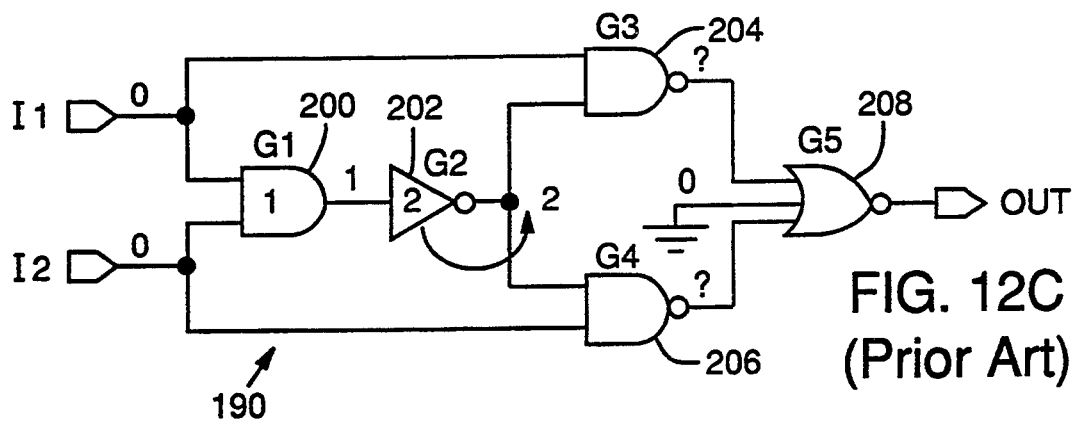

FIG. 12C shows the next levelization processing pass. AND gate 200 is not processed because its level has already been determined. The input of inverter 202 is now defined as level-1, so inverter 202 is marked as level-2 in the net-list. NAND gates 204 and 206 and NOR gate 208 have only one input defined and are skipped. The level-2 notation is propagated to the output of inverter 202, to initialize the next processing pass.

During the next levelization processing pass, NAND gates 204 and 206 have both inputs defined (level-0 and level-2), but two of NOR gate 208 inputs remain undefined. Another levelization pass completes processing for NOR gate 208.

Figure 12D:
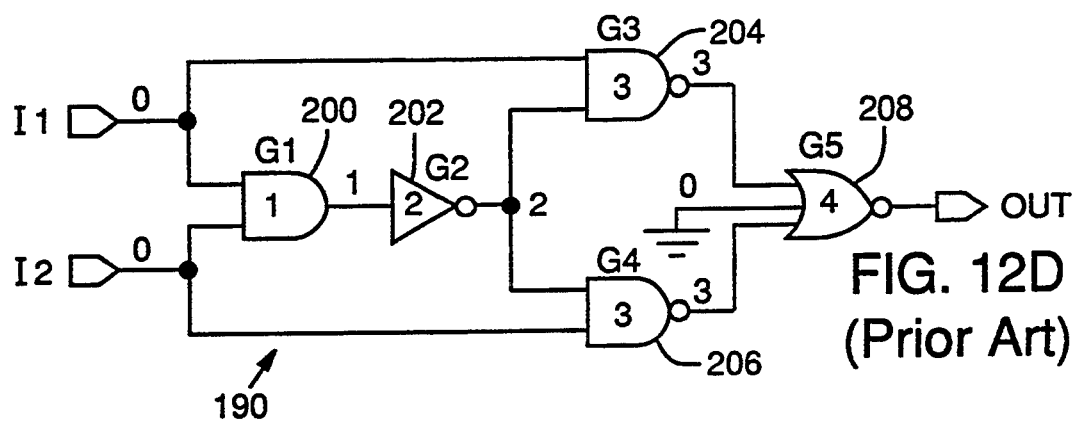

FIG. 12D shows circuit 190 with all its elements completely processed. As many processing passes as necessary are used to complete the levelization processing of an arbitrary circuit.

The levelized XOR gate circuit 190 can be expressed in the following C-like pseudo-code:

```
G1Out = I1 & I2;           /* Level-1 */
G2Out = G1Out;             /* Level-2 */
G3Out = I1 & G2Out;        /* Level-3 */
G4Out = I2 & G2Out;        /* Level-3 */
OUT = G3Out | 0 | G4Out;   /* Level-4 */
```

Figure 13:
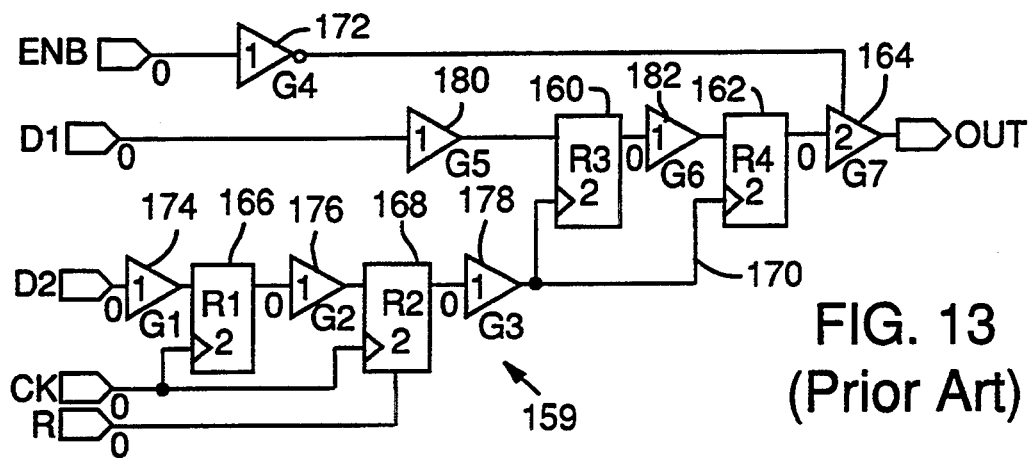
FIG. 13 shows the circuit diagram of FIG. 11 labeled with levelization conditions at the completion of the prior art levelization method.

A significant modeling failure results if the prior art levelization method just described is applied to mixed synchronous and asynchronous circuit 159, which is reproduced in FIG. 13. Levelization initial conditions (level-0) are shown on all input ports (ENB, D1, D2, CK, and R) and on all register outputs (flip-flops 166, 168, 160, and 162). When the conventional levelization method is applied to circuit 159, incorrect levels result, as shown in FIG. 13. Incorrectly levelized circuit 159 can be expressed in the following C-like pseudo-code:

```
G1Out = D2;                    /* Level-1 */
G2Out = R1Out;                 /* Level-1 */
G3Out = R2Out;                 /* Level-1 */
G4Out = ENB;                   /* Level-1 */
G5Out = D1;                    /* Level-1 */
G6Out = R3Out;                 /* Level-1 */
Out = TSBUF(G4Out, R4Out);     /* Level-2 */
R1Out = DFFR(CK, G1Out);       /* Level-2 */
R2Out = DFFR(CK, G2Out, R);    /* Level-2 */
R3Out = DFF(G3Out, G5Out);     /* Level-2 */
R4Out = DFF(G3Out, G6Out);     /* Level-2 */
```

When the code above is evaluated by a simulator, the following functional failure results. Buffer 178 always evaluates prior to flip-flop 168, causing flip-flop 160 to miss delayed clock signal 170. In particular, when CK changes from logic 0 to logic 1, the output of flip-flop 168 changes from logic 0 to logic 1. Evaluation propagates the prior logic 0 of flip-flop 168 through buffer 178 and updates flip-flop 168 to a logic 1. The clock input of flip-flop 160 does not receive the change from logic 0 to logic 1 and therefore fails to store the state of buffer 180. The next time CK changes from logic 0 to logic 1, the resulting simulator evaluation propagates the logic 1 stored in flip-flop 168 through buffer 178, thereby clocking flip-flip 160 one clock period late. If input D1 changes during the delay, the prior value of D1 is stored in flip-flop 160, resulting in a simulation failure.

The simulation failure described above is not surprising because the conventional levelization method assumes the logic circuit is entirely synchronous.

Figure 14:
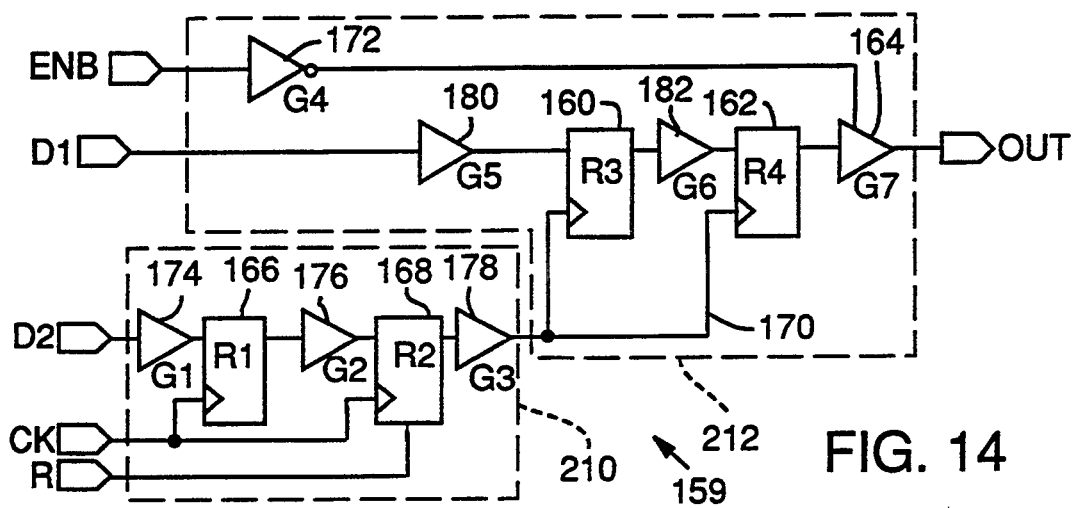
FIG. 14 shows the circuit diagram of FIG. 11A divided into two synchronous circuit blocks having an asynchronous interconnection.

FIG. 14 shows circuit 159 divided into two synchronous sub-sections 210 and 212 electrically connected by an asynchronous signal, delayed clock signal 170. Circuit 159 is typical of circuits found in complex integrated circuits. Mixed synchronous and asynchronous circuits include peripheral controllers, system bus controllers, and distributed clocking circuits. Technology trends suggest that integrated circuits are becoming more like "systems on chips" requiring the extensive use of such mixed circuits.

Accurate simulation of mixed synchronous and asynchronous circuits requires an improved levelization method. Subcircuits 210 and 212 can each be independently and correctly levelized by the conventional synchronous levelization method. However, a method for levelizing the asynchronous interconnection (delayed clock signal 170) is still required. Such a method is described below.

Referring again to FIG. 11D, the partitioning of logic circuits into synchronous WHEN partitions W and asynchronous WHEN-CONDITION partitions WC provides a necessary structural "data hook" for implementing the required levelization method, referred to hereafter as "partitioned levelization."

Partitioned levelization is applied in two steps. Step 1 represents applying synchronous levelization to WHEN partitions W and AFTER partitions A, and step 2 represents applying an asynchronous levelization method (described below) to WHEN-CONDITION partitions WC. When the partitioning information is added to the simulation model code, a correct simulation results.

Figure 15:
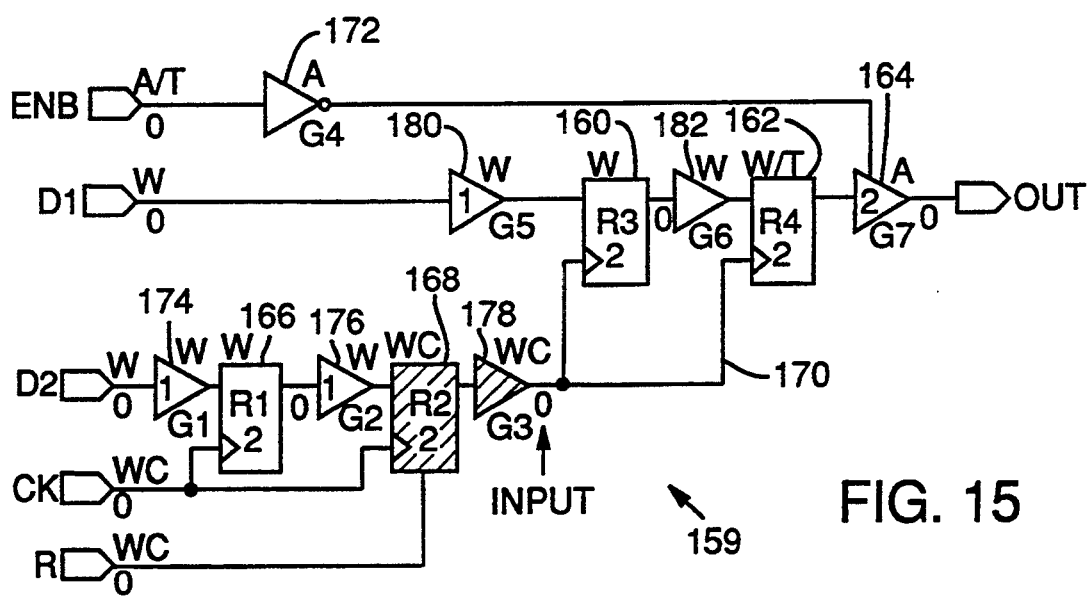
FIG. 15 shows the circuit diagram of FIG. 11 labeled with levelization conditions existing after a synchronous levelization step according to this invention.

FIG. 15 shows the results of applying step 1, synchronous levelization, to circuit 159. Circuit elements in WHEN-CONDITION partition WC (flip-flop 168 and buffer 178) are ignored. The output of buffer 178 is considered an "input" to flip-flops 160 and 162 and is, therefore, assigned a level-0 initial condition.

Figure 16:
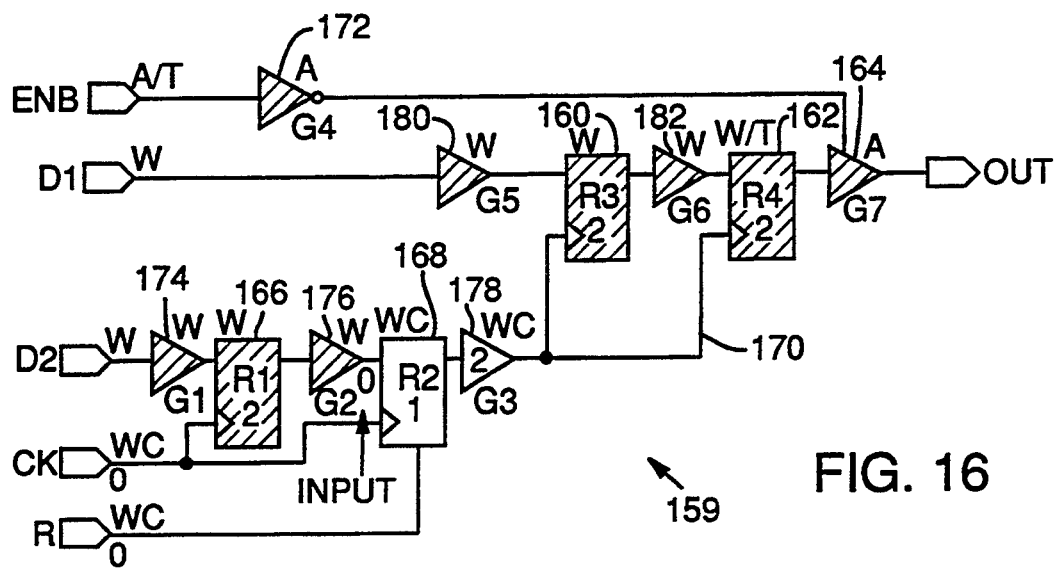
FIG. 16 shows the circuit diagram of FIG. 11 labeled with levelization conditions existing after an asynchronous levelization step according to this invention.

FIG. 16 shows the results of applying step 2 of the partitioned levelization method to WHEN-CONDITION partition WC. Step 2, asynchronous levelization, requires altering the initial levelization conditions. Unlike synchronous levelization, asynchronous levelization does not initially define register (flip-flop) outputs to level-0. This causes flip-flop 168 to levelize prior to buffer 178.

Figure 17:
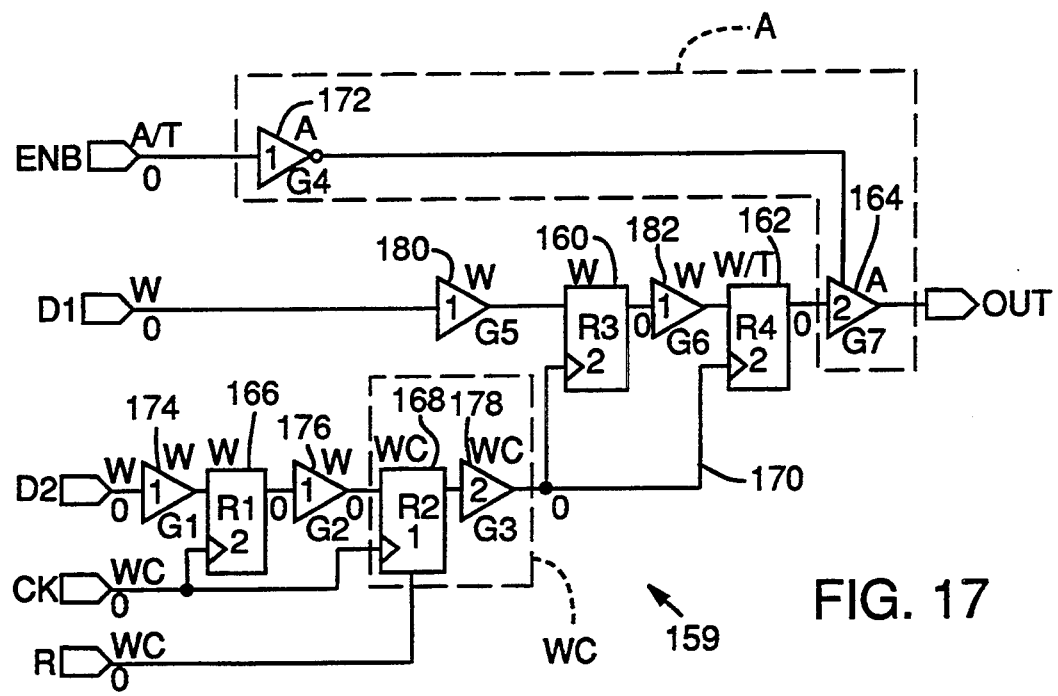
FIG. 17 shows the circuit diagram of FIG. 11 labeled with levelization conditions existing after a partitioned levelization method according to this invention.

FIG. 17 shows the levelization values resulting from partitioned levelization. Circuit elements belonging to WHEN-CONDITION partition WC and AFTER partition A are shown enclosed in a box; all other elements belonging to WHEN partition W. When a simulator evaluates the model, WHEN-CONDITION partition WC evaluates before updating any WHEN registers W, thereby ensuring that the asynchronous ordering problem identified earlier is corrected. More specifically, correct synchronous behavior results because the logic element evaluation order is 168, 178, 166, and 176 rather than 166, 176, 168, and 178.

FIG. 18 shows a block diagram of an improved simulation model 219 including an asynchronous WHEN-CONDITION code block 220. FIG. 19 shows a flow diagram representing the execution flow of simulation model 219 and its interaction with a typical logic simulator. Evaluation of WHEN code block 120 is improved by adding asynchronous WHEN-CONDITION code block 220 functional evaluation steps. Referring to FIG. 19, execution by a simulator of model 219 flows according to the following steps:

Simulation model 219 is invoked by an input signal change 150.

Decision block 151 represents an inquiry as to the particular nature of input signal change 150.

If input signal change 150 is a When-Condition signal change, all WHEN code functions not associated with transport registers 130 are evaluated as indicated by process blocks 152, 230, and 232. Process block 230 represents an evaluation of all WHEN-CONDITION code functions and updates When-Condition registers. Process block 232 represents an evaluation of transport registers 130 and the return of updated transport register 130 and When-Condition register values to a process block 234. Process block 234 represents the storage of transport register, AFTER input, and WHEN register states upon a NO response or completion of a YES response to the WHEN-CONDITION signal change inquiry of decision block 151.

A Re-scheduling point 236 represents a temporary suspension of model execution and a re-scheduling of model execution, which resumes after the transport delay times 134 stored in transport register 130 have elapsed. The simulator performs other tasks until rescheduling causes model execution to resume, causing evaluation of stored transport register 130 and AFTER input 132 values.

A process block 238 represents evaluating AFTER code 122 after the re-scheduling time expires, and returning to the simulator output values representing logic circuit signal changes.

Improved evaluation model 219 provides accurate representations of logic circuit functionality and propagation delay for complex logic circuits.

Simulation model code representing circuit 159, partitioned and levelized according to this invention as shown in FIG. 17, can be represented by the following C-like pseudo-code:

```
/* WHEN Code */
G1Out = D2;                          /* WHEN Level-1 */
G2Out = R1Out;                       /* WHEN Level-1 */
G5Out = D1;                          /* WHEN Level-1 */
G6Out = R3Out;                       /* WHEN Level-1 */
/* WHEN-CONDITION Code */
R2Out = DFFR(CK, G2Out, R);          /* WHEN-CONDITION
                                        Register Level-1 */
G3Out = R2Out;                       /* WHEN-CONDITION
                                        Level-2 */
R1Out = DFF(CK, G1Out);              /* WHEN Register
                                        Level-2 */
R3Out = DFF(G3Out, G5Out);           /* WHEN Register
                                        Level-2 */
R4Out = DFF(G3Out, G6Out);           /* WHEN Register
                                        Level-2 */
/* AFTER Code */
G4Out = ENB;                         /* AFTER Level-1 */
```

-continued

```
Out = TSBUF(G4Out, R4Out);           /* AFTER Level-2 */
```

Logic circuits having local asynchronous feedback loops can still cause the partitioned levelization method to fail, resulting in incorrect functional evaluation of the circuit. Such failures are caused by failing to account for localized timing delays and stem from the fact levelization requires that all inputs to a circuit element have an initially defined level. The following example violates that requirement.

Figure 20A:
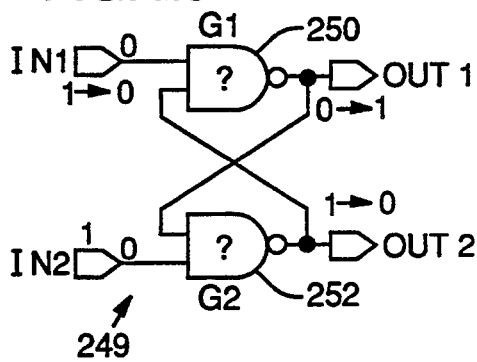
FIG. 20A is a simplified schematic circuit diagram of a cross-coupled latch showing synchronous feedback levelization failure.

FIG. 20A shows a set-reset ("SR") latch circuit 249 having a pair of cross-coupled NAND gates 250 and 252. A pair of inputs IN1 and IN2 are initialized to level-0, and a pair of outputs OUT1 and OUT2 are undefined. NAND gate 250 cannot be levelized because of an undefined input connected to OUT2. Likewise, NAND gate 252 cannot be levelized because of an undefined input connected to OUT1. In reality, SR latch circuits function correctly because of propagation delays in the feedback loops, whereas the levelization method ignores delays.

Figure 20B:
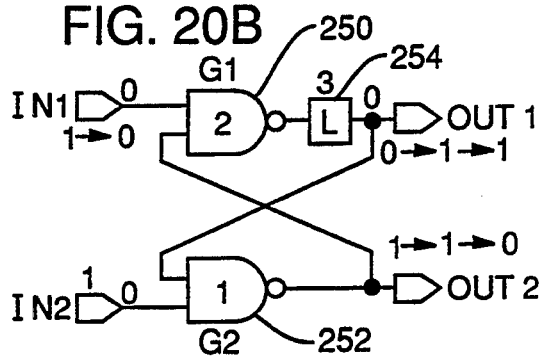
FIG. 20B shows the circuit of FIG. 20A with synchronous levelization corrected by inserting a "leveler" in the feedback loop in a manner according to this invention.

Referring to FIG. 20B, the levelization failure can be solved by inserting a delay-like element into the SR latch simulation model. A storage element, referred to hereafter as a leveler 254, is inserted into the feedback loop at the output of NAND gate 250. Leveler 254 functions by holding its input value between evaluation steps. Leveler 254 behaves like a register, but unlike a register, the output of leveler 254 always provides an initial level-0 condition for the levelization method. Leveler 254 is not a time delay element, but causes an additional evaluation iteration by the simulator, thereby creating a functional evaluation effect like that of a time delay.

Proceeding again with the levelization method, both inputs to NAND gate 252 are level-0, making it level-1. Input IN1 to NAND gate 250 is level-0, and the other input is electrically connected to OUT2, which is level-1, thereby making NAND gate 250 level-2. The input to leveler 254 is level-2, thereby making leveler 254 level-3.

Figure 21A:
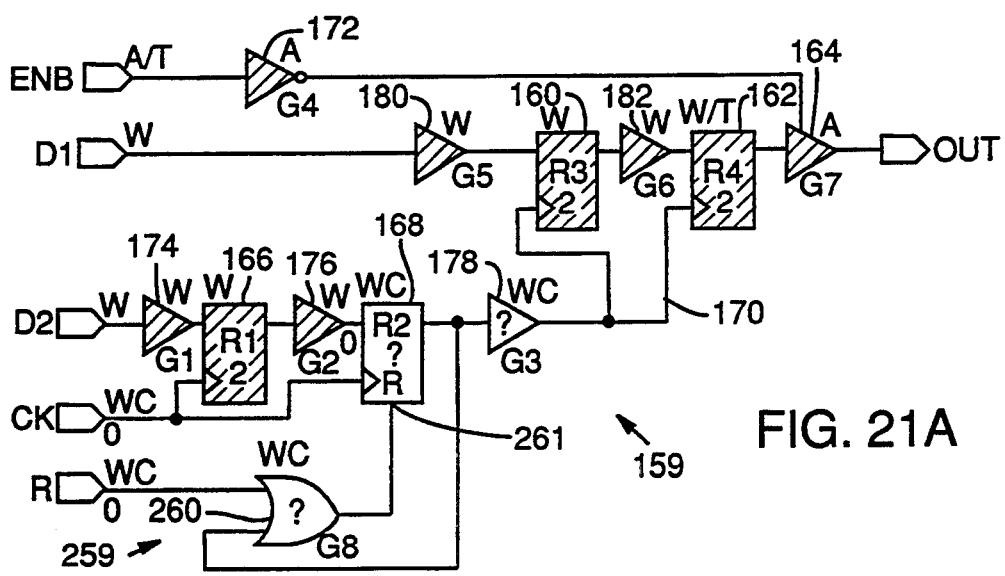
FIG. 21A shows the circuit of FIG. 11A further including a feedback loop that produces an asynchronous levelization failure.

FIG. 21A shows mixed synchronous and asynchronous logic circuit 159 with a reset logic circuit 259 added to flip-flop 168. Reset logic circuit 259, which includes a two-input OR gate 260 connected to flip-flop 168, is another circuit that causes levelization failure. In operation, the output of OR gate 260 is electrically connected to a reset input 261 of flip-flop 168. One input of OR gate 260 receives Input R, and the other input of OR gate 260 is electrically connected to the output of flip-flop 168, thereby providing an asynchronous "self-clearing" function.

Referring briefly to FIG. 17, flip-flop 168 is in WHEN-CONDITION partition WC, and its output should be level-b 2. However, as shown in FIG. 21A, when applying the levelization method to circuit 259, the clock and data inputs of flip-flop 168 are initialized to level-0, but reset input 260 depends on the output state of flip-flop 168. Therefore, levelization fails because of the asynchronous feedback loop formed through OR gate 260.

Figure 21B:
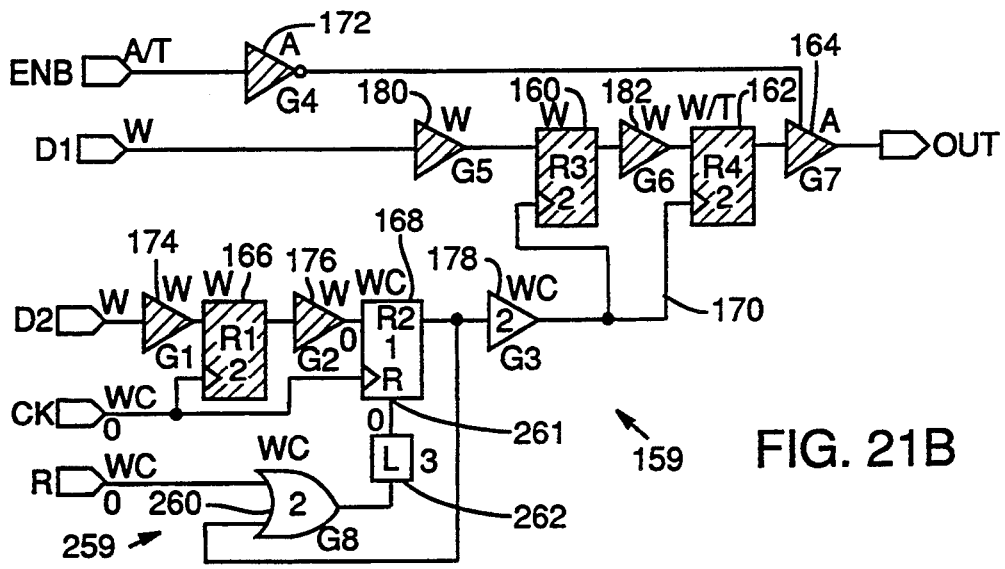
FIG. 21B shows the circuit of FIG. 11A with asynchronous levelization corrected by inserting a "leveler" in the feedback loop in a manner according to this invention.

FIG. 21B shows a circuit 259 with a leveler 262 inserted into the feedback loop to correct the levelization failure. Because leveler 262 provides an initial level-0 condition, all inputs of flip-flop 168 are defined at level-0, and the loop can be resolved. Proceeding with the levelization method, flip-flop 168 is level-1, OR gate 260 is level-2, and leveler 262 is level-3.

In the examples of FIGS. 20B and 21B, the respective levelers 254 and 262 are shown inserted into feedback loops at preferred locations at undefined inputs. In practice, a leveler can be placed anywhere within a feedback loop and still provide its desired function. However, the insertion of a leveler into an asynchronous feedback loop can result in incorrect functional evaluation of the model. FIG. 20A shows logic states representing the correct functional behavior of the SR latch example, as contrasted with the functional behavior of the leveler-based latch shown in FIG. 20B.

Referring to FIG. 20A, assume input IN1 changes from logic 1 to logic 0, and input IN2 is a constant logic 1. OUT1 is initially a logic 0, and OUT2 is initially a logic 1. The SR latch correctly responds to a logic 1 to logic 0 change on IN1 by changing OUT1 to logic 1 and OUT2 to logic 0.

Referring to FIG. 20B a simulator will evaluate NAND gate 252 first (level-1) by using the logic 0 from leveler 254 and the logic 1 on IN1, resulting in a logic 1 on OUT2. NAND gate 250 evaluates next (level 2) by using the logic 0 on IN1 to generate a logic 1. Leveler 254 evaluates next (level 3), propagating the logic 1 to OUT1. The evaluation causes an incorrect logic 1 state on OUT2.

The functional evaluation failure can be corrected by repetitively evaluating the asynchronous loop until no further evaluation changes occur. Re-evaluation is triggered by a logic state change on the input to leveler 254 with the following results. NAND gate 252 receives the logic 1 from leveler 254 and generates a logic 0 on OUT2. NAND gate 250 also re-evaluates, but no additional change results at leveler 254 or at OUT1, thereby indicating stable and logically correct loop conditions.

Figure 22:
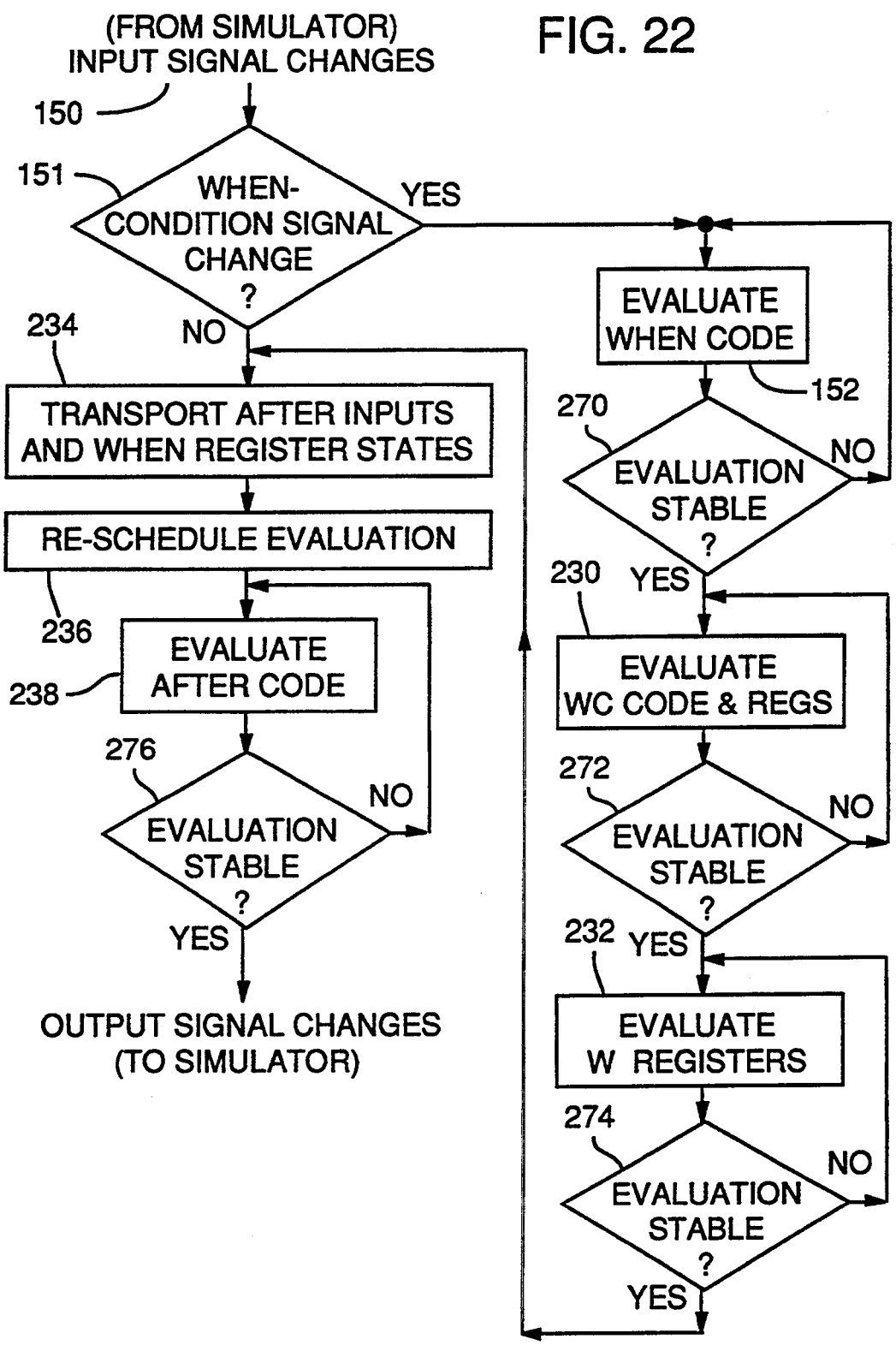
FIG. 22 is a generalized block diagram of the simulation model functional evaluation process of FIG. 19 further improved with levelization feedback re-evaluation and stability checking according to this invention.

FIG. 22 shows a flow diagram representing an execution flow of simulation model 219 and its interaction with a typical logic simulator. The process of FIG. 22 proceeds similarly to that of FIG. 19 but is improved by adding decision blocks 270, 272, 274, and 276 following the respective process blocks 152, 230, 232, and 238. The processes performed by the decision blocks are substantially the same; therefore, one will be described by way of example.

Process block 152 indicates the functional evaluation of code representing the modeled circuit.

Decision block 270 represents checks for a change on a leveler input (if one exists) and a re-evaluation by process block 152 if a change is detected. Otherwise, evaluation results are passed to process block 230.

The logic circuit modeling improvements of this invention are described by way of example and provide a system and method for accurately modeling the functionality and timing of a complex logic circuit having mixed synchronous and asynchronous subcircuits and/or local asynchronous delays. The improvements include a WHEN-CONDITION partition for identifying boundaries between synchronous and asynchronous subcircuits, a partitioned levelization method for levelizing mixed synchronous and asynchronous circuits, and a "leveler" element for evaluating asynchronous local time delays. The simulation model execution process includes re-evaluation and evaluation stability checking steps that provide correct functional and timing evaluation of the simulation model. Of course, not all logic circuits have mixed synchronous and asynchronous subcircuits and/or local asynchronous delays, so skilled workers will recognize that the above-described improvements may be selectively applied to logic circuit models as required by their particular circuits. Skilled workers will also recognize that a leveler inserted at the interface between a synchronous and an asynchronous subcircuit causes correct evaluation of the mixed circuit, albeit with a sacrifice in simulation performance. Therefore, the above-described partitioned levelization and evaluation reordering method of modeling a mixed synchronous/asynchronous circuit is preferred, but the leveler method is within the scope of this invention.

Sample pseudo-code representing a simulation model of circuits 159 and 259 is shown below. The code includes all of the above-described improvements—WHEN-CONDITION partitioning, partitioned levelization, a "leveler," and a "leveler call" that includes a "reeval" flag address for causing loop re-evaluation.

```
/* WHEN Code */
G1Out = D2;                          /* WHEN Level-1 */
G2Out = R1Out;                       /* WHEN Level-1 */
G5Out = D1;                          /* WHEN Level-1 */
G6Out = R3Out;                       /* WHEN Level-1 */
/* WHEN-CONDITION Code */
Reeval = True;
while (Reeval) {
    Reeval = False;
    R2Out = DFFR(CK, G2Out, LOut);
        /* WHEN-CONDITION Register Level-1 */
    G3Out = R2Out;                   /* WHEN-CONDITION
                                        Level-2 */
    G8Out = R | R2Out;               /* WHEN-CONDITION
                                        Level-2 */
    /* If LOut changes, set the Re-evaluation Flag */
    LOut = LEVELER(LOut, G8Out, &Reeval);
                                     /* WHEN-CONDITION
                                        Level-3 */
    R1Out = DFF(CK, G1Out);          /* WHEN Register
                                        Level-2 */
    R3Out = DFF(G3Out, G5Out);
                                     /* WHEN Register
                                        Level-2 */
    R4Out = DFF(G3Out, G6Out);
                                     /* WHEN Register
                                        Level-2 */
}
/* AFTER Code */
G4Out = ENB;                         /* AFTER Level-1 */
Out = TSBUF(G4Out, R4Out);           /* AFTER Level-2 */
```

It will be obvious to those skilled in the art that many changes may be made to the details of the above-described embodiment of this invention without departing from the underlying principles thereof. Accordingly, it will be appreciated that this invention is also applicable to logic circuit modeling applications other than those found in integrated circuit development. The scope of the present invention should be determined, therefore, only by the following claims.

I claim:

1. A method of making a simulation model of a logic circuit having synchronous and asynchronous subcircuits, each of the subcircuits including one or more elements, comprising the steps of:

describing the logic circuit with a net-list that lists the elements and associated interconnections among them;

tracing the net-list the logic circuit into AFTER code, WHEN code, and WHEN-CONDITION code partitions to accurately model functional boundaries between the synchronous and asynchronous subcircuits;

inserting a transport delay between the WHEN code and the AFTER code to accurately simulate the synchronous and asynchronous subcircuits; and compiling the simulation model so that the partitioning is retained in the simulation modeling code, thereby resulting in a correct simulation of the logic circuit.

2. The method of claim 1 in which the net-list includes a listed output port having associated therewith a trace path that includes one or more predecessor elements and in which the tracing step comprises the steps of:

tracing the net-list from the listed output port back through each predecessor element until reaching a trace path termination point at an input port or a register output;

identifying each element along the trace path as a member of an AFTER code partition; and identifying each trace path termination point as either an input to the AFTER code partition or a transport register output.

3. The method of claim 1 in which the net-list includes a listed register synchronous data input having associated therewith a trace path that includes one or more predecessor elements and in which the tracing step comprises the steps of:

tracing the net-list from the listed register synchronous data input back through each predecessor element until reaching a trace path termination point at an input port or a register output;

identifying each element along the trace path as a member of a WHEN code partition; and identifying each trace path termination point as an input to the WHEN code partition.

4. The method of claim 1 in which the net-list includes a listed register asynchronous control input having associated therewith a trace path that includes one or more predecessor elements and in which the tracing step comprises the steps of:

tracing the net-list from the listed register asynchronous control input back through each predecessor element until reaching a trace path termination point at an input port or a register output;

identifying each element along the trace path as a member of a WHEN-CONDITION code partition; and identifying each trace path termination point as an input to the WHEN-CONDITION partition.

5. A method of executing in a simulator a simulation model of a logic circuit including synchronous and asynchronous subcircuits, the model being partitioned into WHEN code including a WHEN register code, WHEN-CONDITION code including a WHEN-CONDITION register code, and AFTER code including an AFTER input code, comprising the following steps implemented in a computer program:

invoking the simulation model with a WHEN-CONDITION input code change received from the simulator;

evaluating the WHEN code but not evaluating the WHEN register code;

evaluating the WHEN-CONDITION code and the WHEN-CONDITION register code;

evaluating the WHEN register code;

updating the AFTER input code and the WHEN register code;

evaluating the AFTER code after a transport delay time has elapsed; and sending an AFTER code value to the simulator.

6. The method of claim 5 in which each of the evaluating steps further includes the step of repetitively evaluating the code until successive evaluations are stable.

7. The method of claim 5 further including the steps of:

inserting into a modeled interconnection in the model of the asynchronous subcircuit a leveler model having an input value and an output level;

evaluating the simulation model having the leveler repetitively until successive evaluations of the input value are stable; and sending a stable model evaluation result to the simulator.

8. The method of claim 7 in which the leveler comprises a storage element model in which the output level is initially level-0 during levelization and the input value is held constant between evaluations.

9. The method of claim 7 in which the asynchronous subcircuit comprises a feedback loop.

* * * * *

UNITED STATES PATENT AND TRADEMARK OFFICE
CERTIFICATE OF CORRECTION

PATENT NO. : 5,392,227
DATED : February 21, 1995
INVENTOR(S) : Jay A. Hiserote

It is certified that error appears in the above-indentified patent and that said Letters Patent is hereby corrected as shown below:

Column 3, line 28, after "Simulator"" insert --,--.

Column 5, line 31, after ""level-1"" insert --,--.

Column 6, line 11, change "wellknown" to --well-known--.

Column 11, line 58, change "DFFR(CK, G1Out)" to --DFF(CK, G1Out)--.

Column 14, line 57, change "level-b 2" to --level-2--.

Column 16, line 66, change "tracing the net-list the logic" to --tracing the net-list to identify elements of the logic circuit by partitioning the logic--.

Column 16, line 68, change "to" to --which--.

Signed and Sealed this

Fifth Day of September, 1995

Attest:

BRUCE LEHMAN

Attesting Officer    Commissioner of Patents and Trademarks